United States Patent
Acharya et al.

(10) Patent No.: US 7,373,571 B2
(45) Date of Patent: May 13, 2008

(54) ACHIEVING DESIRED SYNCHRONIZATION AT SEQUENTIAL ELEMENTS WHILE TESTING INTEGRATED CIRCUITS USING SEQUENTIAL SCAN TECHNIQUES

(75) Inventors: Yatin R Acharya, Bangalore (IN); Anand Bhat, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/908,637

(22) Filed: May 20, 2005

(65) Prior Publication Data
US 2006/0242507 A1    Oct. 26, 2006

(30) Foreign Application Priority Data
Apr. 7, 2005    (IN) .................. 390/CHE/2005

(51) Int. Cl.
*G01R 31/28*    (2006.01)
(52) U.S. Cl. .................. 714/729; 714/726; 714/727; 714/744; 714/30; 327/261; 327/269; 327/270; 713/400; 713/401
(58) Field of Classification Search .................. None
See application file for complete search history.

(56) References Cited

U.S. PATENT DOCUMENTS

| | | | | |
|---|---|---|---|---|
| 5,254,942 A | * | 10/1993 | D'Souza et al. | 714/727 |
| 5,878,055 A | * | 3/1999 | Allen | 714/744 |
| 5,987,620 A | * | 11/1999 | Tran | 713/600 |
| 6,070,260 A | * | 5/2000 | Buch et al. | 714/731 |
| 6,286,118 B1 | * | 9/2001 | Churchill et al. | 714/726 |
| 6,286,119 B1 | * | 9/2001 | Wu et al. | 714/726 |
| 6,380,785 B2 | * | 4/2002 | Fisher | 327/269 |
| 6,795,931 B1 | * | 9/2004 | LaBerge | 713/401 |
| 6,880,137 B1 | * | 4/2005 | Burlison et al. | 716/4 |
| 2005/0278593 A1 | * | 12/2005 | Muradali et al. | 714/724 |
| 2006/0242505 A1 | * | 10/2006 | Bialas et al. | 714/726 |

* cited by examiner

*Primary Examiner*—John P Trimmings
(74) *Attorney, Agent, or Firm*—Yingsheng Tung; Wade James Brady, III; Frederick J. Telecky, Jr.

(57) ABSTRACT

A programmable delay circuit is provided in either data input path or a clock input path of a sequential element contained in a scan chain of an integrated circuit. The scan chain is used to test the integrated circuit using a sequential scan technique (e.g., Automatic test pattern generation (ATPG)). Due to the programmability of delay magnitude, the burden on a designer to achieve synchronization of the data input with the clock signal while testing, is reduced.

6 Claims, 1 Drawing Sheet

ACHIEVING DESIRED SYNCHRONIZATION AT SEQUENTIAL ELEMENTS WHILE TESTING INTEGRATED CIRCUITS USING SEQUENTIAL SCAN TECHNIQUES

BACKGROUND OF THE INVENTION

1. Field of the Invention

The present invention relates to the field of design for testability of electronic circuits, and more specifically to a method and apparatus for achieving desired synchronization at sequential elements while testing integrated circuits using sequential scan techniques.

2. Related Art

Sequential scan techniques are often used to test integrated circuits. To support sequential scan techniques, integrated circuits are often designed to connect various sequential elements as a scan chain, i.e., the output of one element is connected as an input to the next element in the chain by a corresponding connecting path, with the first element in the chain being designed to receive bits of a input scan vector and the last element in the chain being designed to provide the output scan vector ("scan output"). The path starting from the point at which the input is received to the point at which the output is delivered is referred to as a scan chain path. Automatic test pattern generation (ATPG) is an example of one such sequential scan technique.

There is a general need to synchronize the data input (i.e., the bits of the scan vector) received from the prior sequential element with the clock signal driving the present sequential element. The synchronization is performed to ensure the setup and hold timings of the (present) sequential element are satisfied, as is well known in the relevant arts. The synchronization can be achieved either by delaying the clock input or the data input, as is also well known in the relevant arts. For conciseness, the description is substantially provided with respect to introducing delays in the data path, though the approaches would be applicable to introducing delays in the clock path as well.

One reason for the need for implementing delays to achieve synchronization in scan chains is that different connecting paths may provide different delays (e.g., due to the corresponding lengths of the connecting paths) in propagating the signal to the input of the next sequential element in the scan chain. To ensure that the signals arrive at corresponding sequential elements within desired the timing constraints, delay elements may be provided at least in the paths which otherwise provide small delays.

The determination and implementation of the delay magnitude on each path poses several challenges. For example, in a typical scenario, a designer designs an integrated circuit both for sequential scan testing (in a test mode) and to provide desired features (in a normal mode of operation) at a logical level (i.e., focusing on merely the logical connections between the elements) using various tools. A layout design is then generated from the logical design, with the physical layout determining the placement of various sequential elements and the length of the connecting paths.

A designer may need to modify the logical design to introduce additional delay elements if the prior physical layout is deemed not to satisfy the timing requirements. The layout design is then again checked for conformance with the timing requirements, and the logical design and layout generation are continued iteratively until a layout satisfies the desired synchronization requirements. Such iterative approach generally consumes time and resources (designer time, computational tools, etc.), and is therefore undesirable.

What is therefore needed is a method and apparatus which enables achieving desired synchronization at sequential elements while testing integrated circuits using sequential scan techniques.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention provides a programmable delay circuit, which can be used to delay either a clock signal or a data input signal to achieve a desired synchronization at a sequential element in a scan chain while testing an integrated circuit using sequential scan techniques. Due to the programmability, the designers burden of having to modify the circuit design/layout to achieve desired delays/synchronization, may be substantially reduced (thereby reducing overall cost, as well as time to design an integrated circuit).

In one embodiment, the delay circuit is implemented in the form of a combinatorial logic, which provides a delay magnitude determined by a digital value received from an external source. As a result, the delay magnitude can be dynamically adjusted by setting the digital value to an appropriate value.

Various aspect of present invention overcome at least some of the limitation described above. Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Integrated Circuit

Figure 1:
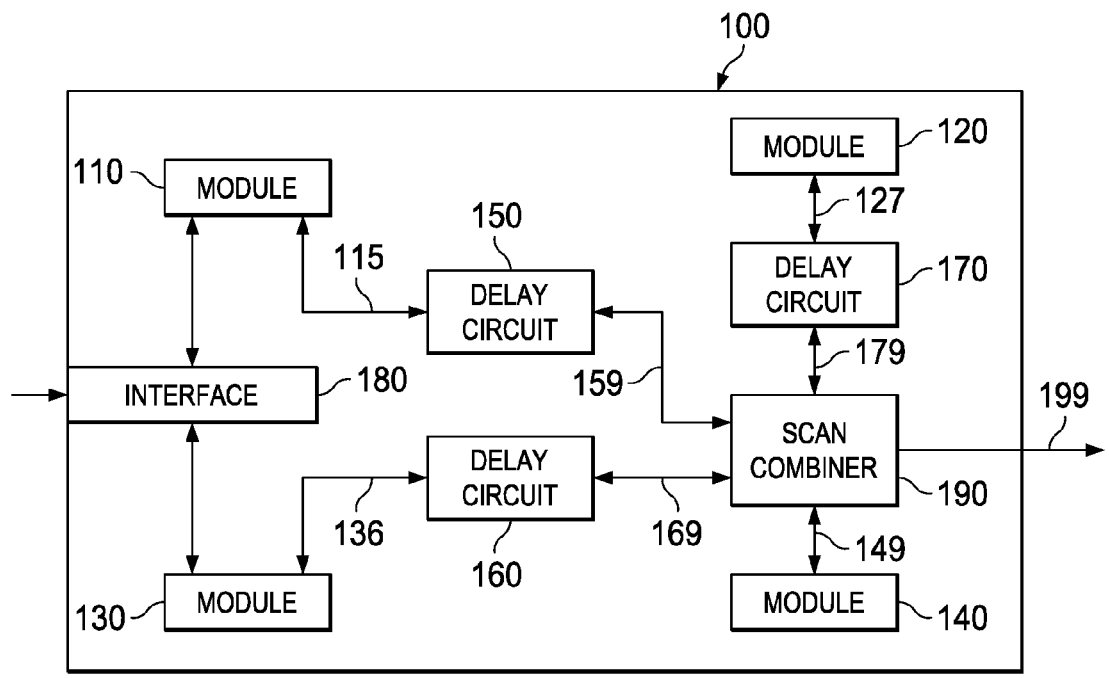
FIG. 1 is a block diagram illustrating the details of an integrated circuit, in which various aspects of the present invention can be implemented.

FIG. 1 is a block diagram illustrating the details of an example integrated circuit in which various aspects of the present invention can be implemented. Integrated circuit 100 is shown containing modules 110, 120, 130 and 140, delay circuits 150, 160 and 170, interface logic 180 and scan combiner 190. Each block is described in further detail below.

Each module 110, 120, 130 and 140 represents a functional block operating to provide a desired feature. At least some of the modules may correspond to "IP cores", which are supplied by external vendors and integrated into integrated circuit 100. Each module can contain a corresponding scan chain, which generates a corresponding scan output (on paths 115, 136, 127 and 149 respectively). All the modules are assumed to operate from a common clock (not shown) in test mode (according to a sequential scan technique), even though the modules operate using independent clock signals in normal (operating) mode.

Interface logic 180 provides a required interface (e.g., any signal translation, timing changes) between modules 110 and 130. Additional interface logic may also be present between other pairs/combinations of modules, and is not shown in the interest of avoiding obscuring the features of the present invention.

Scan combiner 190 receives the scan outputs generated by modules 110, 120, 130 and 140, combines the scan outputs into a combined scan output, and presents the combined scan output on path 199. It is assumed that scan combiner 190 needs to receive the scan outputs on paths 159, 169, 179 and 149 synchronous with the common clock signal. It is assumed that module 140 provides the scan output with the required synchronization.

Delay circuits 150, 160 and 170, provided according to various aspects of the present invention, ensure that the scan output provided by respective modules 110, 120 and 130 are also presented to scan combiner 190 synchronous with the common clock signal. The manner in which delay circuits 150, 160 and 170 can be implemented, is described in sections below. However, various features of such implementations will be clearer in comparison to a prior system in which at least some features of the present invention are not implemented. Accordingly, the details of such a prior system are described below first.

3. Prior Delay Circuit

Figure 2:
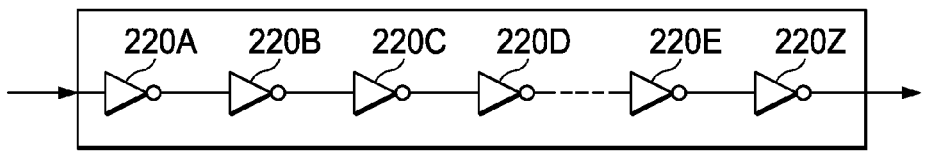
FIG. 2 is a block diagram illustrating the details of a prior delay circuit.

According to a prior approach, a designer computes the desired delay in each path and incorporates appropriate number of delay elements 220A-220Z in series (as shown in FIG. 2) in the path to achieve the computed delay. Each delay element propagates the input data value to the output with a finite known delay, and thus the delay circuit of FIG. 2 provides an aggregate delay equaling the sum of delays provided the delay elements 220A-220Z shown in FIG. 2.

One problem with the above approach is that the desired aggregate delay on each path may not be known at least until the layout stage (since layout determines, to some extent, the length of the connecting paths), and changes to aggregate delay requires a designer to redesign the delay circuit at the logical design stage. Such iterative design approach is undesirable, as noted above in the background section. As aspect of the present invention overcomes some of such problems as described below in further detail.

4. Invention

Figure 3:
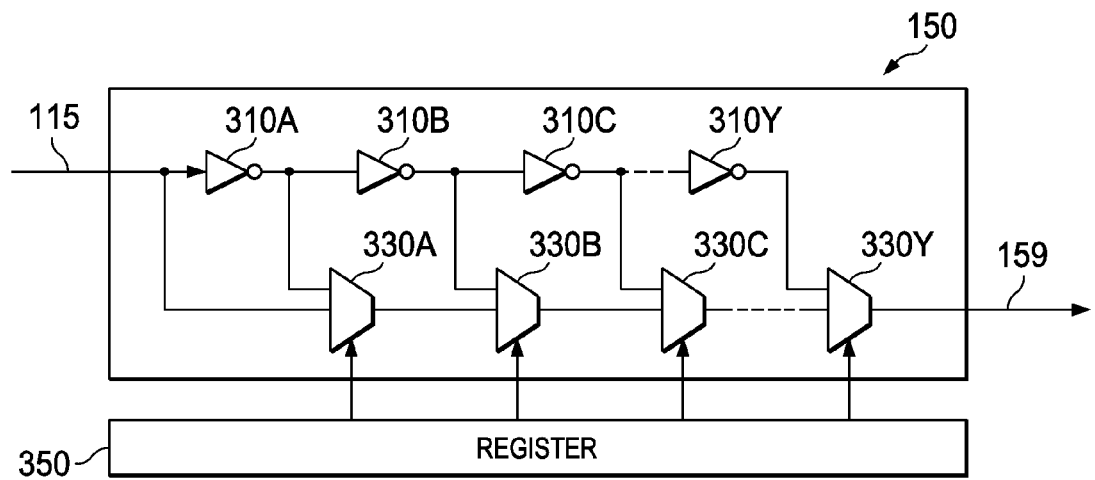
FIG. 3 is a block diagram illustrating the details of a delay circuit provided according to various aspects of the present invention.

FIG. 3 is a block diagram illustrating the manner in which delay circuit 150 can be implemented according to various aspects of the present invention. Delay circuits 160 and 170 also can be implemented similarly. Delay circuit 150 is shown containing delay elements 310A-310Y, which include inverter circuits, multiplexers 330A-330Y, and register 350. As described below in further detail, the value in register 350 can be set to control the delay magnitude caused by the circuit of FIG. 3.

Delay elements 310A through 310Y are shown connected in series, with delay element 310A being designed to receive the scan output bits from path 115. Multiplexer 330A is shown receiving path 115 on one input (1) and the output of delay element 310A on the second input (0). Multiplexer 330B is shown receiving the output of multiplexer 330A on one input (1) and the output of second delay element 310B on the second input (0).

Similarly, the remaining multiplexers receive the output of a previous multiplexer on 1 input and the output of the corresponding delay element on the 0 input. Each multiplexer 330A through 330Y selects either from 0 input or 1 input as controlled by the corresponding select bit received from register 350. Thus, a sequence of multiplexers can be programmed to effectively bypass the corresponding number of delay elements in the path of the scan output bits, as described below in further detail.

The value of register 350 is programmed to control the delay magnitude caused by delay circuit 150. In particular, the value is set to a number of 0s in leading (MSB) positions followed by a number of 1s. The number of 0s causes a corresponding number of delay elements to be included in the delay path. For example, a value of 0001 . . . 1 (three 0s followed by all ones) causes delay circuit 150 to provide an aggregate delay equaling the sum of the delays caused by delay elements 310A, 310B and 310C.

A maximum delay can be achieved by setting the value to all 0s and minimum delay is achieved by setting the value to all 1s. For simplicity, it may be assumed that multiplexers do not add significant delay (compared to the delay elements).

From the above, it may be appreciated that register 350 can be set to an appropriate value dynamically even during operation to achieve a desired delay. The delay can be used either in the data path or clock path for each sequential element to achieve the desired synchronization in test mode.

Registers available for other purposes can be conveniently used for register 350, provided the registers are not part of the corresponding scan chains. In one embodiment, register 350 corresponds to a JTAG (Joint Test Action Group, a commonly used term for IEEE 1149.1 which defines the standard to test chips on a board) register, which is otherwise available for testing peripheral connections.

Due to the use of programmable delay circuits, the desired synchronization can be easily attained even while testing integrated circuits after fabrication. Thus, the burden of obtaining synchronization may be reduced on designers.

5. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An integrated circuit comprising:
   a interface logic circuit;
   a plurality of functional block circuits connected to the interface logic circuit;
   a plurality of delay circuits each connected to a functional block circuits, each delay circuit including
      a plurality of delay elements connected in series, each of the plurality of delay elements providing a corresponding delay, a first delay element receiving an input signal from an output of a corresponding functional block circuit; and
      a plurality of multiplexers connected in series, each of the plurality of multiplexers receiving a signal from a previous multiplexer and a signal from a corresponding delay element, and outputting a signal according to a signal from a programmable register; and
      the programmable register operable to receive a digital pattern according to which the multiplexers are to be activated, thereby controlling the amount of delay of an output signal of each of the plurality of the functional blocks and thereby synchronizing the output signals of the plurality of functional blocks; and a scan combiner circuit connected to the delay circuits to receive the synchronized output signals.

2. The integrated circuit of claim 1, in which the delay circuits are controlled by a clock signal when operating in a test mode.

3. The integrated circuit of claim 1, in which the delay elements include inverter circuits.

4. The integrated circuit of claim 1, in which each delay element has a first time delay between an input signal and an output signal; each multiplexer has a second time delay between a plurality of inputs and an output signal; the integrated circuit having an aggregate delay related to the first time delay of the delay elements, to which the second time delays of the multiplexer do not add significantly.

5. An integrated circuit comprising:
   an interface logic circuit;
   a plurality of functional block circuits connected to the interface logic circuit;
   a plurality of delay circuits each connected to a functional block circuits, each delay circuit including
      a plurality of delay elements connected in series, each of the plurality of delay elements providing a corresponding delay, a first delay element receiving an input signal from an output of a corresponding functional block circuit; and
   a plurality of multiplexers connected in series, each of the plurality of multiplexers receiving a signal from a previous multiplexer and a signal from a corresponding delay element, and outputting a signal according to a signal from a programmable register; and
   the programmable register operable to receive a digital pattern according to which the multiplexers are to be activated, thereby controlling the amount of delay of an output signal of each of the plurality of the functional blocks and thereby synchronizing the output signals of the plurality of functional blocks;
   a scan combiner circuit connected to the delay circuits to receive and combine the synchronized output; and
   a scan output signal connected to the scan combiner.

6. The integrated circuit of claim 4, in which the sequential scan technique includes automatic test pattern generation (ATPG).

* * * * *